United States Patent
He et al.

(10) Patent No.: US 8,269,395 B2
(45) Date of Patent: Sep. 18, 2012

(54) TRANSLATING AND ROTATION MICRO MECHANISM

(76) Inventors: Siyuan He, Toronto (CA); Ridha BenMrad, Toronto (CA)

(*) Notice: Subject to any disclaimer, the term of this patent is extended or adjusted under 35 U.S.C. 154(b) by 183 days.

(21) Appl. No.: 12/894,737

(22) Filed: Sep. 30, 2010

(65) Prior Publication Data
US 2011/0080627 A1    Apr. 7, 2011

Related U.S. Application Data

(60) Provisional application No. 61/248,004, filed on Oct. 2, 2009.

(51) Int. Cl.
*H02N 1/00* (2006.01)
(52) U.S. Cl. .................. 310/309; 310/308
(58) Field of Classification Search .......... 310/308–309
See application file for complete search history.

(56) References Cited

U.S. PATENT DOCUMENTS

| | | | |
|---|---|---|---|
| 5,914,801 A * | 6/1999 | Dhuler et al. | 359/230 |
| 6,507,138 B1 * | 1/2003 | Rodgers et al. | 310/309 |
| 7,355,318 B2 * | 4/2008 | Dean et al. | 310/309 |
| 7,705,514 B2 * | 4/2010 | He et al. | 310/309 |
| 7,872,394 B1 * | 1/2011 | Gritters et al. | 310/309 |
| 2008/0106169 A1 * | 5/2008 | Nagara | 310/309 |

* cited by examiner

*Primary Examiner* — Thanh Lam
(74) *Attorney, Agent, or Firm* — Nasser Ashgriz

(57) ABSTRACT

A translation and rotation mechanism is disclosed, which comprises of one or more bi-directional electrostatic actuators. Each bi-directional electrostatic actuator comprising of fixed electrodes and movable electrodes, where the fixed electrodes of each actuator being attached onto a base. The movable electrodes of each actuator are connected to the translating and rotation unit through a spring system. The movable elements of each said actuator being able to rotate with respect to the base plane by applying voltage signals to the actuator and by controlling the voltage signals applied to each said actuator independently, said translating and rotation unit being able to translate, rotate, or translate and rotate simultaneously.

15 Claims, 9 Drawing Sheets

(a) Electrode dimensions for torque calculation (b) Side view of electrodes

TRANSLATING AND ROTATION MICRO MECHANISM

CROSS REFERENCE TO THE RELATED APPLICATION

This application claims the benefit of the earlier filed U.S. Provisional patent application, with application No. 61/248,004, file on Oct. 2, 2009, the entire contents of which are herein incorporated by reference.

FIELD OF THE INVENTION

The present invention relates to the field of micro translating and rotation mechanisms and Micro Optical Electro Mechanical Systems (MOEMS).

BACKGROUND OF THE INVENTION

Translating and rotation micro mechanisms can be used in many applications such as adaptive optics for wavefront corrections, spatial light modulation, micro endoscopic confocal imaging, positioning micro lenses for auto focusing/zooming, aligning optical components, micromanipulators or micro stages. Most of these applications require a large out-of-plane translation or rotation or both, e.g., more than 10 μm is needed for adaptive optics modules used in large size ground telescopes, more than 20 μm is needed for wavefront corrections in adaptive optics modules used in vision science, and several tens to several hundred micrometers are needed for positioning micro lenses for auto focusing/zooming, alignment of optical devices, micro manipulators, micro stages, optical coherence tomography and confocal microscopy imaging applications, and several degrees of rotation in 2D is needed for imaging and display applications.

Various micro mechanisms were developed in order to achieve a large out-of-plane translation and rotation. These include those designs based on micro electrostatic actuators, exemplified by a device by V. Milanovic et al. (published in IEEE Photonics Technology Letters, Vol. 16, pp. 1891-1893, 2004), electrothermal actuators, exemplified by a device designed by A. Jain and H. Xie (published in IEEE Journal of Selected Topics in Quantum Electronics, Vol. 13, pp. 228-234, 2007), and electromagnetic actuators, exemplified by a device by I-J Cho and E. Yoon (published in J. Micromech. Microeng. Vol. 19, pp. 1-8, 2009).

Micro electrothermal actuator based designs have achieved out-of-plane translation of several hundred micrometers. However, electrothermal actuator based designs require high power (10s~100s mW), are slow to respond and have low accuracy. Electromagnetic actuator based designs have achieved an out-of-plane translation of 84 μm. Drawbacks of electromagnetic designs include high power consumption, e.g., 100s mW and difficulty in fabrication of the magnetic thin films or the need for an external magnetic field. Compared with micro electrothermal and electromagnetic actuator based designs, micro electrostatic actuator based designs offer much lower power consumption (less than 1 mW or even zero power consumption when used for maintaining a static position), fast response, high accuracy and high compatibility with CMOS fabrication technologies. However, it is very challenging to achieve a large out-of-plane translation and rotation using electrostatic actuators. A number of micro electrostatic actuators have been developed in order to lead to a larger out-of-plane displacement. For example, an out-of-plane translation of 5 μm was achieved by the actuator presented by F. Pardo et al., (published in the Journal of Microelectronic Engineering, Vol. 84, pp. 1157-1161, 2007), which used in-plane comb-drive actuators whose rotation was converted into an out-of-plane translation. The design presented by M. A. Helmbrecht, et al. (published in the Proc. SPIE, Vol. 6223, 2006, pp. 622305.1-622305.7) is a parallel-plate actuator which achieved an out-of-plane translation of 7.5 μm by raising the moving electrode using the residual stress in order to obtain a large initial gap. A micro electrostatic actuator presented by V. Milanovic, et al. (published in IEEE Journal of Selected Topics in Quantum Electronics, Vol. 10, pp. 462-471, 462-471, 2004) achieved an out-of-plane translation of 60 μm. This actuator utilized a vertical comb-drive structure plus a rotation transformer mechanism. The actuator was fabricated using front and back side etching of an SOI wafer.

In light of the foregoing discussion, there is a need for a micro translating and rotation actuator device with large translation and rotation capabilities.

SUMMARY OF THE INVENTION

A repulsive-force driven large stroke out-of-plane translation micro electrostatic actuator is disclosed. The preferred embodiment of the present translation actuator consists of four repulsive-force rotation driving units and a translating unit. The present embodiments are fabricated using the surface micromachining technology (PolyMUMPs).

The present translating and rotation mechanism comprises of a translating and rotation part, multiplicity of bi-directional electrostatic actuators, as described in U.S. Pat. No. 7,705,514 and which is incorporated here by reference, and in which each actuator elastically connected to the translating and rotation unit.

One object of the present actuator is to provide both micro translation and rotation to various micro devices.

Another object of the present actuator is to provide a large out-of-plane translation, larger than that of any prior art micro electrostatic actuator.

Another object of the present invention is to provide a method of operating the translating and rotation mechanism comprising steps of: (a) providing a base; (b) providing a translating and rotation unit; (c) providing two or more bi-directional electrostatic actuators with fixed elements attached onto the base; (d) providing flexible structures elastically connecting the translating and rotation unit to movable elements of each actuator; (e) applying voltages independently to each actuator to drive the translating and rotation unit to translate, or rotate, or translate and rotate simultaneously.

BRIEF DESCRIPTION OF THE DRAWINGS

Embodiments herein will hereinafter be described in conjunction with the appended drawings provided to illustrate and not to limit the scope of the claims, wherein like designations denote like elements, and in which:

DETAILED DESCRIPTION OF THE INVENTION

Figure 1:
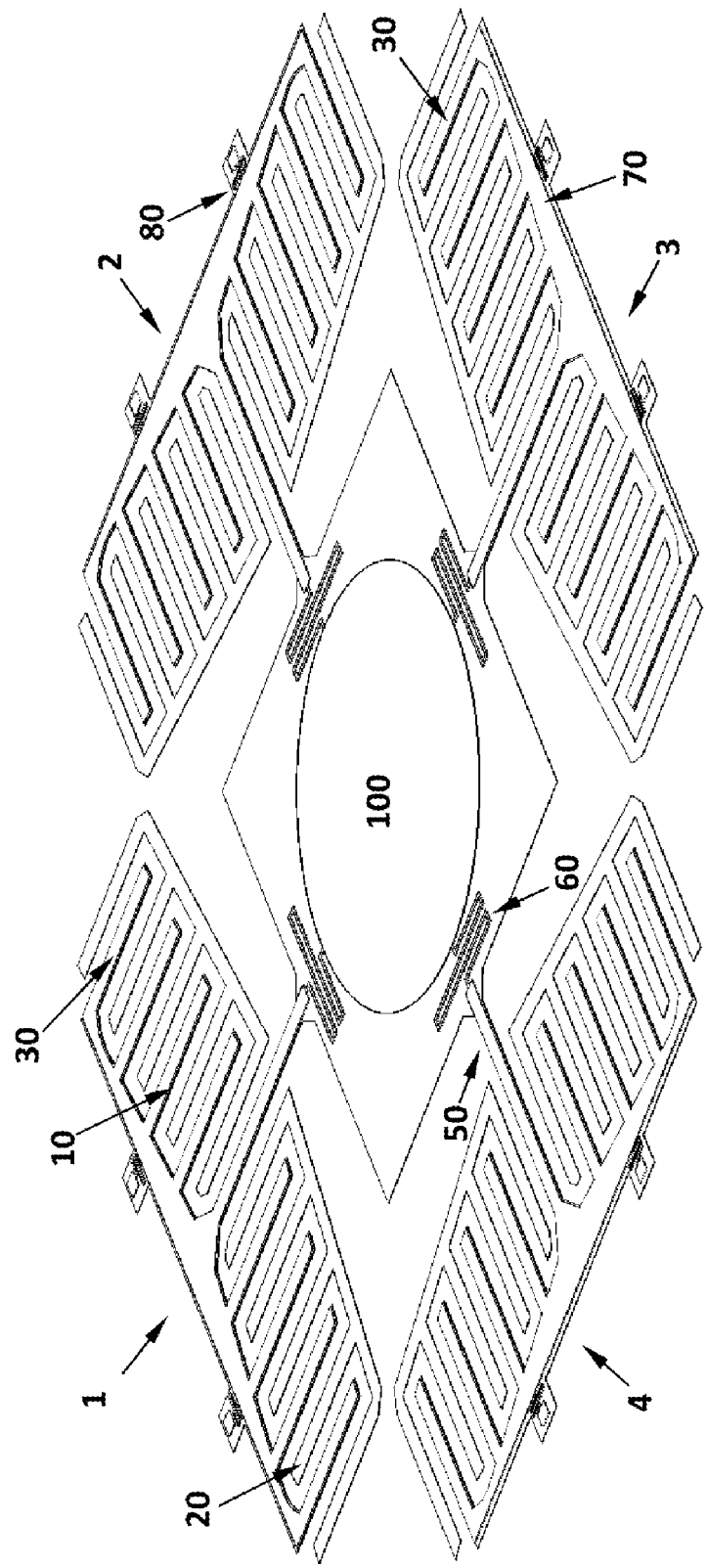
FIG. 1 is a perspective view illustrating a translating and rotation mechanism in accordance with an embodiment of the invention.

Embodiments herein provide a large stroke out-of-plane translation micro actuator. In the description of the embodiments herein, numerous specific details are provided, such as examples of components and/or mechanisms, to provide a thorough understanding of embodiments herein. One skilled in the relevant art will recognize, however, that an embodiment herein can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments herein.

One embodiment of the large stroke out-of-plane translation micro actuator disclosed here (see FIGS. 1 and 2) is comprised of a central translating unit 100 and four of repulsive-force rotation actuators, 1, 2, 3, and 4, which are referred to as rotation driving units. The number of the rotation driving units used depends on the design of the actuator. For instance, only two units can be used to obtain the same effect as the four units shown here. The central translating unit 100 is connected to the middle long moving electrode of each rotation driving unit 50 through a converting spring 60. In the present embodiment, the four rotation driving units are symmetrically located around the translating unit and are subject to the same voltages. Thus at any time, the four rotation driving units rotate out-of-plane by the same angle. When a voltage is applied, the out-of-plane rotation of the four rotation driving units is converted into an out-of-plane translation of the central translating unit through the four converting springs 60. The translating unit could be a mirror plate, an electrode for a tunable capacitor/inductor, a platform for positioning a micro lens or a platform for a micro stage/manipulator. In each rotation driving unit, the moving finger electrodes are connected to a common supporting beam 70 which is anchored to the substrate through two anchoring springs 80. The motion of each of the units affects the motion of the others, and therefore, the units are dependent.

The principal of the operation of a repulsive-force micro electrostatic actuator was previously disclosed by the same inventors (He and BenMrad), in U.S. Pat. No. 7,705,514, details of which are incorporated here by reference. In summary this type of actuator comprises of a base containing a plurality of electrodes; having a movable element being movably connected to the base, the moveable element including a plurality of electrodes, one or more of the plurality of electrodes having a corresponding aligned electrode on the base, and each aligned electrode on the base being disposed adjacent to at least one non-aligned electrode disposed on the base; and generating one, or both at different intervals, of: a repulsive electrostatic force by applying a voltage of V1 to the electrodes on the movable element, V1 to the aligned electrodes on the base and V2 to the non-aligned electrodes on the base; and/or an attractive electrostatic force by applying a voltage of V1 to the electrodes on the moveable element, and V2 to the aligned and non-aligned electrodes on the base.

Figure 2:
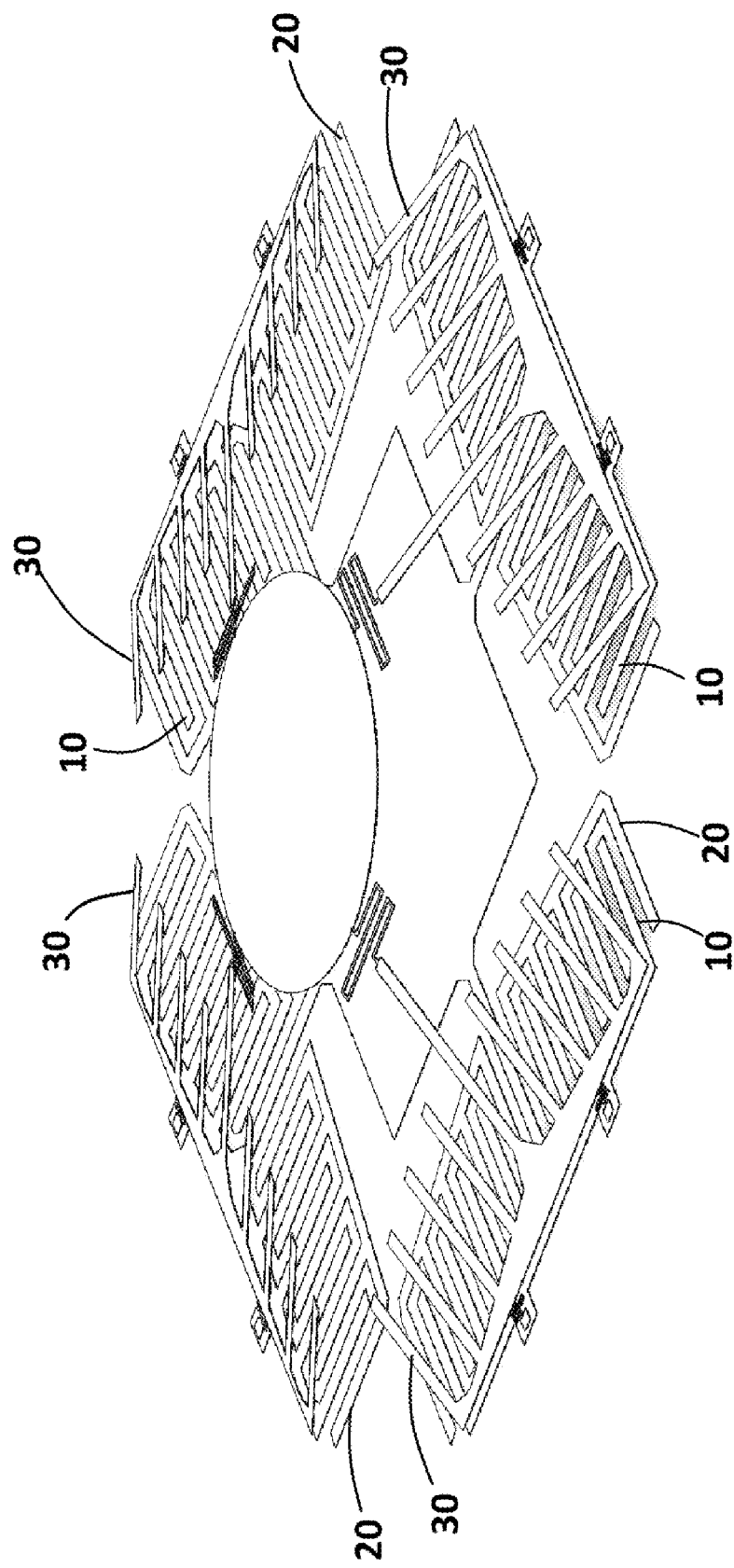
FIG. 2 is a perspective view of the translating and rotation mechanism once voltage is applied to drive the actuator and to cause an out-of-plane displacement.
Figure 3:
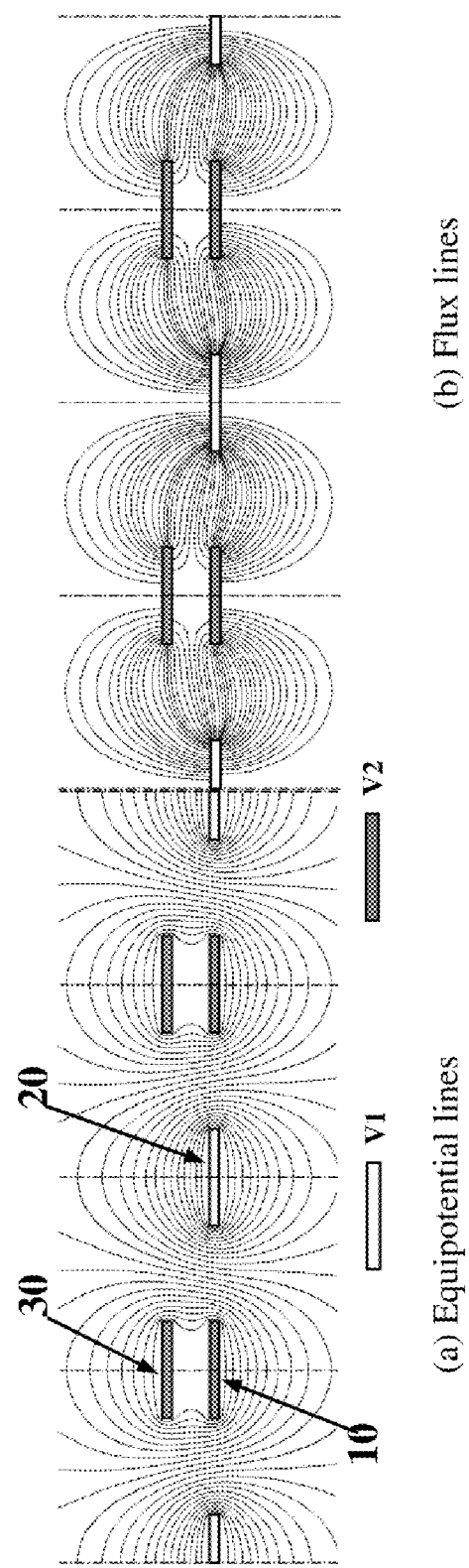
FIG. 3 is an illustration of an asymmetric electric field generated in the repulsive-force actuator.

In accordance with an embodiment herein, the repulsive-force actuator consists of aligned fixed finger electrodes 10, unaligned fixed finger electrodes 20, and moving finger electrodes 30, as shown in FIGS. 1 and 2. When a voltage is applied to the actuator in the manner shown in FIG. 3(a), i.e., the moving and aligned fixed electrodes are subject to one potential and the unaligned fixed electrodes are subject to a different potential, thus an asymmetric electric field about the horizontal central line of each moving electrode is generated. As a result an upward net force acting on each moving electrode is generated and pushes the moving electrodes away from the fixed electrodes. The repulsive-force actuator can achieve a large out-of-plane translation/rotation without suffering from the "pull-in" effect associated with conventional parallel-plate electrostatic actuators. The actuator needs only two thin film layers and thus is suitable for surface micromachining processes.

The moving finger electrodes used in the present actuator can be of different lengths.

When the four rotation driving units are subject to the same voltage, the actuator generates out-of-plane translations. The actuator can also realize rotation. By controlling the voltages applied to the four rotation driving units independently, rotation of the translating unit along any direction (within a rotation range) can be realized.

Figures 4A, 4B, 4C:
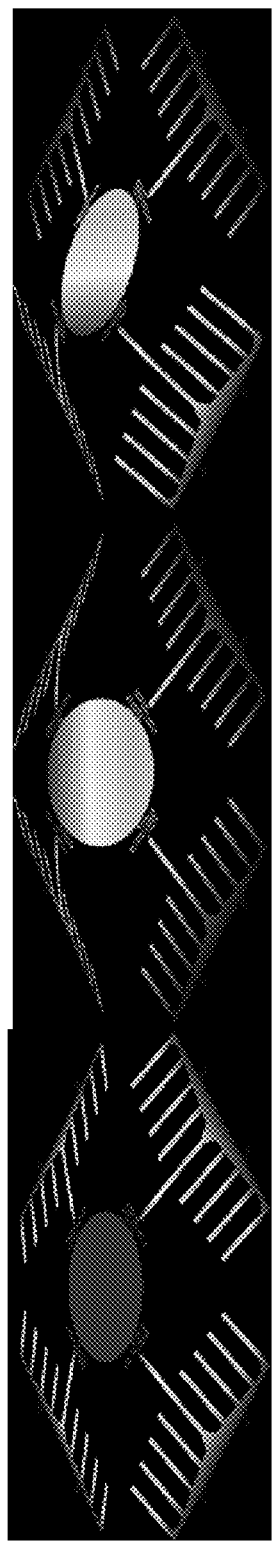
FIG. 4(a) is a perspective view illustrating the translation of the translating and rotation unit of the mechanism of FIG. 1 in accordance with an embodiment of the invention.
FIG. 4(b) is a perspective view illustrating the rotation of the translating and rotation unit of the mechanism of FIG. 1 in accordance with an embodiment of the invention.
FIG. 4(c) is a perspective view illustrating the rotation of the translating and rotation unit of the mechanism of FIG. 1 in accordance with an embodiment of the invention.
Figure 5:
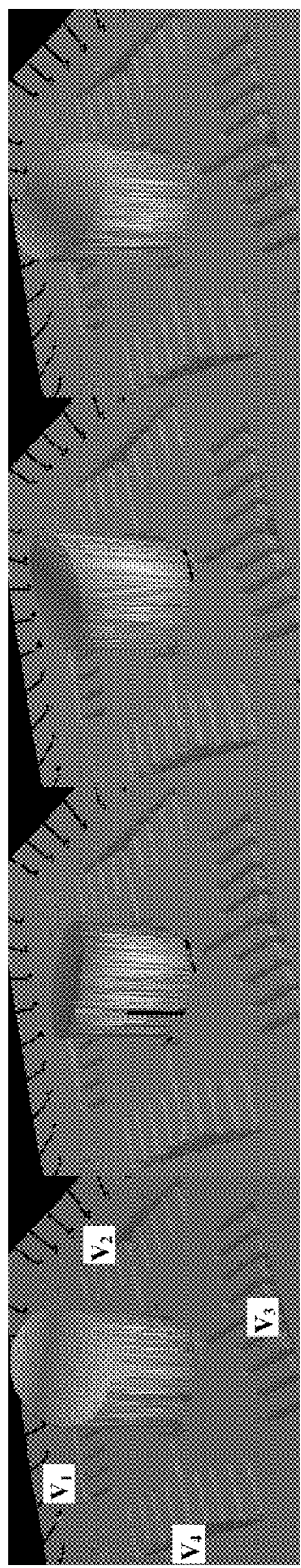
FIG. 5 shows the measured rotation of the translating unit along two orthogonal axes for various input voltages.

FIG. 4 shows examples of controlling the four rotation driving units to rotate the translating unit along two orthogonal axes. $V_1$, $V_2$, $V_3$ and $V_4$ are voltages applied to the rotating driving units 1, 2, 3 and 4 respectively (see FIG. 1). FIG. 4(a) illustrates the translation; FIG. 4(b) illustrates the rotation; and FIG. 4(c) illustrates rotation and translation. FIG. 5 shows the measured rotation of the translating unit when the four rotation driving units are controlled in the manner shown in FIG. 4. In FIG. 5 the moving finger electrodes are not shown because they rotate out-of-plane by an angle of several degrees and thus do not reflect enough light back to the low magnification lens (large focusing length) used in the 3D optical profiler.

Figure 6:
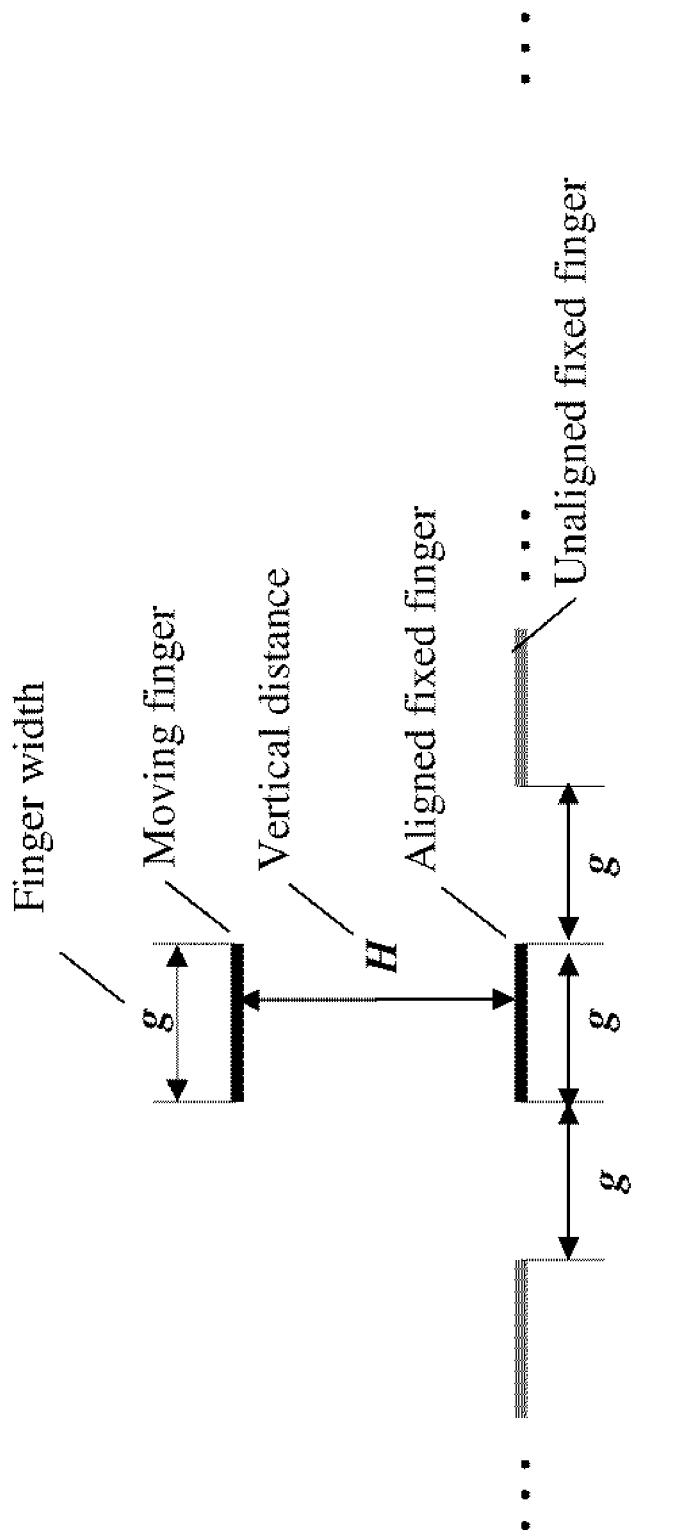
FIG. 6 illustrates the cross section of the finger electrodes of the repulsive-force rotation driving unit.
Figure 7:
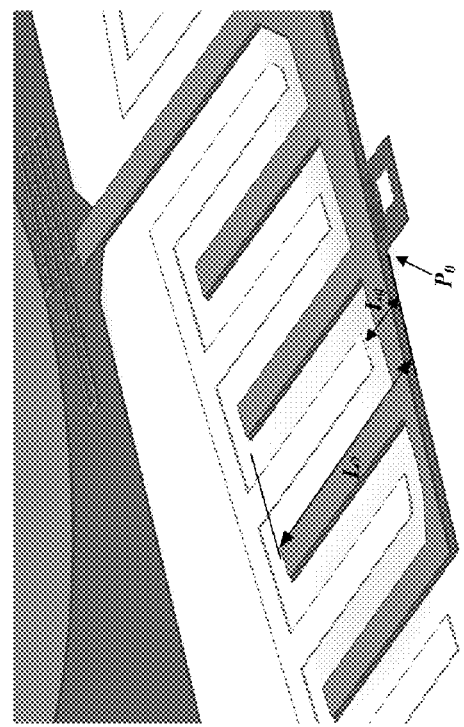
FIG. 7 are schematic diagrams illustrating the parameters influencing the torque generated in a repulsive-force rotation driving unit.
Figure 7:
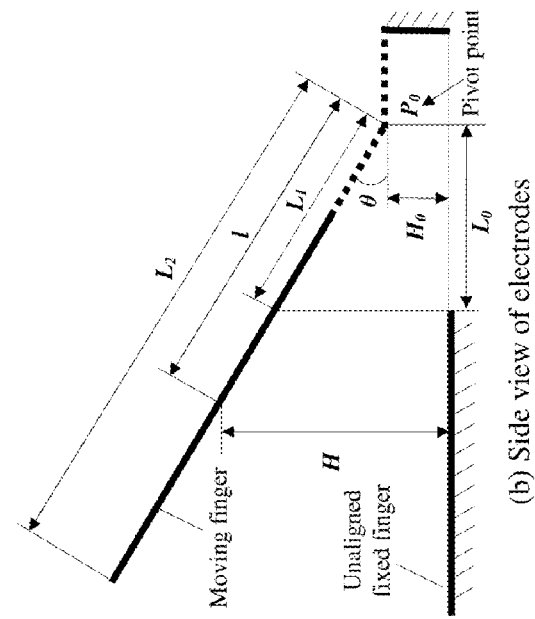

The torque generated in each rotation driving unit depends on all the forces acting on the moving electrodes across the cross section along the moving finger length. According to scaling laws of the repulsive force actuator, the force acting on one moving electrode along the cross section can be expressed in terms of the vertical distance between the fixed and moving finger electrodes H, the applied voltage V, the finger width, g, which may also be the lateral distance between neighboring fixed finger electrodes, and electrode length, L. FIGS. 6 and 7 illustrate different characteristic lengths of an actuator of the present embodiment.

One example of a four rotation unit actuation of the embodiment herein is presented here. Various micromachining processes can be used to construct the present device. PolyMUMPs process is used to fabricate the embodiment herein.

The present large stroke translation micro electrostatic actuator requires only two thin films and is suitable for surface micromachining technology. Prototypes are fabricated using PolyMUMPs. The dimensions of the first embodiment of the actuator are listed in Table I. All fixed finger electrodes of the four rotation driving units are made of Poly0 layer. The moving fingers, converting springs, anchoring springs and the translating unit are made of Poly1 layer. A square electrode made of Poly0 is underneath the translating unit and is subject to the same potential applied to the translating unit as shown in FIG. 1 part 100. This is done in order to prevent the translating unit from sticking to the substrate when a voltage is applied to the actuator.

The initial vertical distance between the fixed and moving electrodes is $H_0=0.75$ microns. The finger width can have different values, preferably $g=51$ microns.

The operation of the device depends on the overall stiffness of the actuator. In order to obtain the system stiffness, two aspects need to be addressed: 1) The relation between the rotation angle of the four repulsive-force rotation driving units and the torque required to reach that angle; 2) The relation between the out-of-plane displacement of the translating unit and the rotation angle of the four rotation driving units.

TABLE I

Structural parameters of the translation actuator (unit: μm).

| Finger width of rotation units | | | Finger length of rotation units | | | | | |
|---|---|---|---|---|---|---|---|---|
| Moving fingers | Aligned fixed fingers | Unaligned fixed fingers | Moving fingers | Middle long moving fingers | Translating unit diameter | Overall dimension of the device | Width of converting springs | Width of anchoring springs |
| 45 | 53 | 51 | 408~455 | 696 | 1000 | 3257 × 3257 | 8 | 4 |

In order to design the actuator for various motions, first a 3D model of the translation micro actuator is developed. Second, upward vertical forces with various magnitudes are applied to the tip of each moving finger electrode and the corresponding out-of-plane rotation of the rotation driving units as well as the out-of-plane displacement of the translating unit are calculated. Based on the simulation results, the relationship between the rotation angle of the four repulsive-force rotation driving units and the applied torque as well as the relationship between the out-of-plane displacement of the translating unit and the rotation angle of the rotation driving units are obtained. The following relations are obtained for the present embodiment:

$$T_{generated\_total} = K_{rotation} \cdot \theta \quad (1)$$

For the embodiment described in Table 1, K is $$K_{rotation} = 24.68e-9 \text{ N·m/rad} \quad (2)$$

$$D = C_{R\_T} \cdot \theta \quad (3)$$

$$C_{R\_T} = 997.43 \text{ μm/rad} \quad (4)$$

where $K_{rotation}$ represents the rotation stiffness, i.e., torque required to rotate a unit angle the four rotation driving units. D is the out-of-plane displacement of the translating unit. $C_{R\_T}$ is the converting factor, i.e., the ratio of the out-of-plane displacement of the translating unit to the rotation angle of the four rotation driving units.

Figure 8:
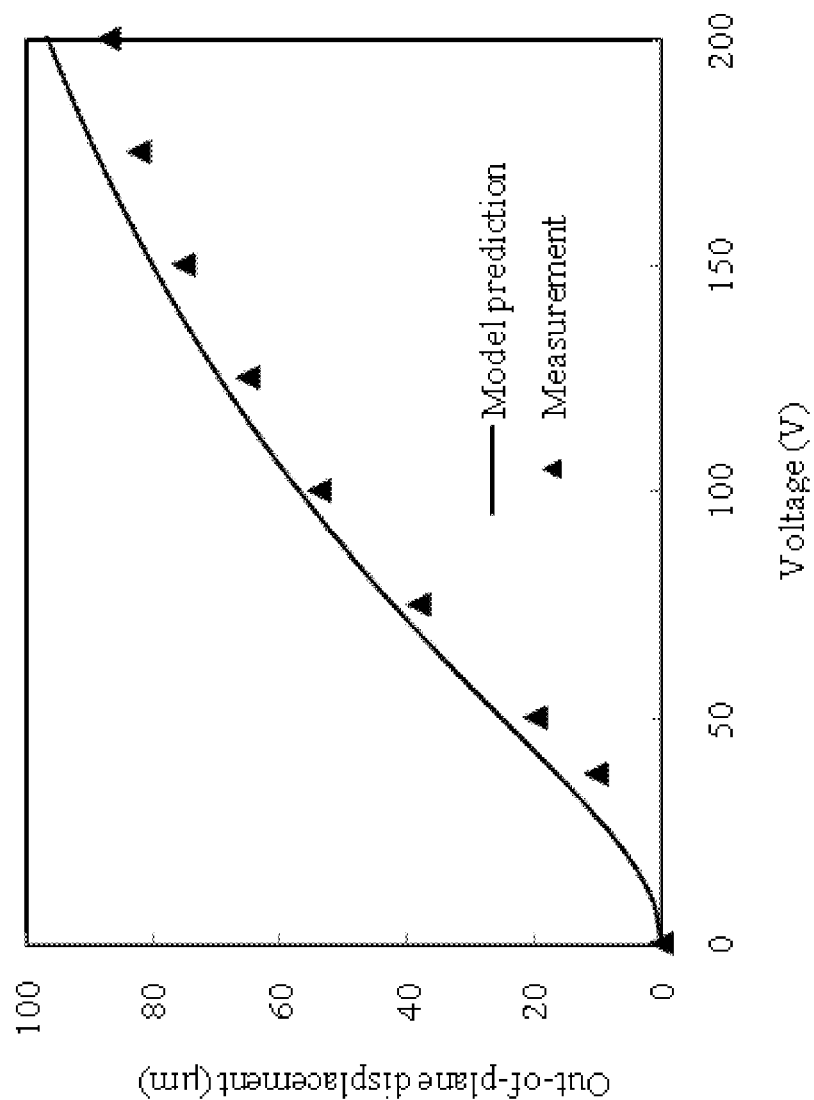
FIG. 8 illustrates the static performance of the first embodiment of the large stroke translation micro actuator.

The static performance of the micro actuator is measured on a 3D optical profiler (Zygo Newview 6300) for a driving voltage of 0 V~200 V. The measured static performance is shown in FIG. 8, which matches well the performance predicted by the model. FIG. 8 shows that the translation micro actuator achieves a static out-of-plane translation of 86 μm for a driving voltage of 200 V. This represents the highest out-of-plane translation achieved by a micro electrostatic actuator thus far. A driving voltage as high as 250 V~300 V was also tried and resulted in an out-of-plane translation of 100 μm.

Figure 9:
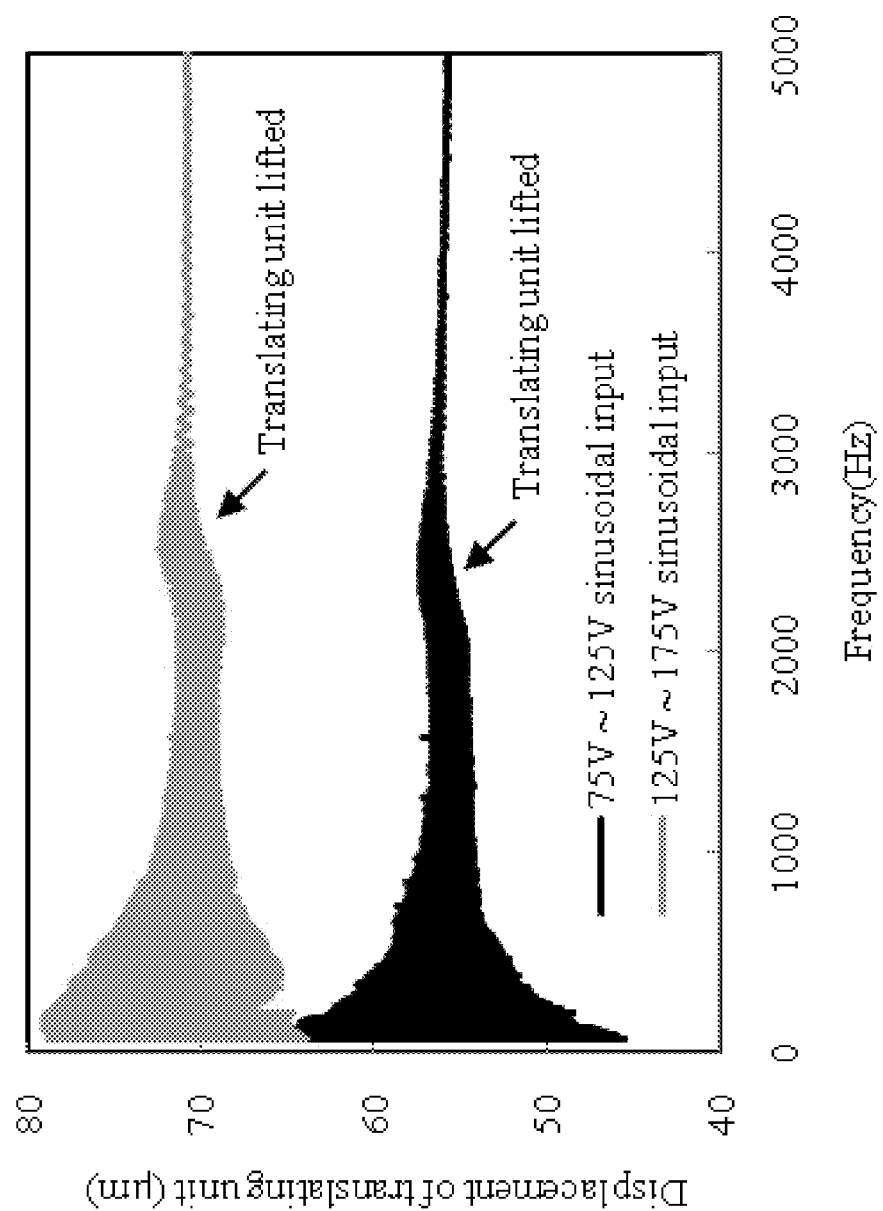
FIG. 9 illustrates the out-of-plane displacement of the translating unit at different oscillation frequencies.

The dynamic performance of the large stroke translating micro actuator is measured on the 3D optical profiler with the Dynamic MEMS (DMEMS) function. A sinusoidal driving voltage (75 V~125 V or 125 V~175 V) with the frequencies of 0 Hz (static), 60 Hz (lowest frequency allowed by the DMEMS function) to 5000 Hz is applied to the actuator. The out-of-plane displacement of the translating unit is monitored at each frequency. At each frequency, the out-of-plane displacement is measured at a phase incremental step of 15° for the frequency range of 60 Hz~200 Hz and 30° for the frequency range of 200 Hz~5000 Hz. The frequency incremental step is: 10 Hz for the frequency range of 60 Hz~200 Hz, 20 Hz for the frequency range of 200 Hz~700 Hz and 50 Hz for the frequency range of 700 Hz~5000 Hz. The measured results are shown in FIG. 9. The vertical axis of FIG. 9 represents the out-of-plane displacement of the translating unit with respect to its static position. The horizontal axis of FIG. 9 represents both time and frequency.

What is claimed is:

1. A translation and rotation mechanism comprising: a base, defining a base plane; a translating and rotation unit to be translated and or rotated; one or more bi-directional electrostatic actuators; one or more suspension springs or flexible structures; each said bi-directional electrostatic actuator comprising of fixed electrodes and movable electrodes; fixed elements of each said actuator being attached onto said base; each said spring or flexible structure connecting movable electrodes of each said actuator to the translating and rotation unit; whereby movable electrodes of each said actuator being able to rotate with respect to the base plane by applying voltage signals to the actuator and by controlling the voltage signals applied to each said actuator independently, said translating and rotation unit being able to translate, rotate, or translate and rotate simultaneously.

2. The mechanism of claim 1, having two bi-directional electrostatic actuators, each elastically connected to opposite sides of the translating and rotating unit, whereby, said unit being rotated in one plane.

3. The mechanism of claim 1, having four bi-directional electrostatic actuators equally spaced around the translating and rotating unit and each elastically connected to said unit, whereby, said unit being rotated in two planes.

4. The mechanism of claim 1, wherein said bi-directional electrostatic actuators having the same or different number of electrodes.

5. The mechanism of claim 1, wherein said bi-directional electrostatic actuators having the same or different electrode length.

6. The mechanism of claim 1, wherein said bi-directional electrostatic actuators having the same or different electrode width.

7. The mechanism of claim 1, wherein said bi-directional electrostatic actuators having the same or different suspension springs or flexible structures.

8. The mechanism of claim 1, wherein the electrodes in each of said bi-directional electrostatic actuators having the same or different electrode length.

9. The mechanism of claim 1, wherein the electrodes in each of said bi-directional electrostatic actuators having the same or different electrode finger width.

10. The mechanism of claim 1, wherein one or more actuators being evenly or unevenly distributed along the circumferential direction of the translating and rotation unit.

11. The mechanism of claim 1, wherein the springs or the flexible structures having the same or different shapes and or dimensions.

12. The mechanism of claim 1, wherein the flexible structures being evenly or unevenly distributed along the circumferential direction of the translating and rotation unit.

13. The mechanism of claim 1, having an overall size of a few millimeters, whereby it may generate translational motions of order of 10 s of microns.

14. The mechanism of claim 1, wherein said translating and rotation unit being a reflective mirror plate to construct a piston/tip/tilt micromirror.

15. A method of operating the translating and rotation mechanism comprising the steps of: (a) providing a base; (b) providing a translating and rotation unit; (c) providing one or more bi-directional electrostatic actuators with fixed elements attached onto the base; (d) providing flexible structures elastically connecting the translating and rotation unit to movable elements of each actuator; (e) a method of applying voltages to actuators to drive the translating and rotation unit to: (i) translate with respect to the base by applying simultaneously the same voltage signals to all actuators; (ii) rotate with respect to the base by applying different voltages to the actuators, wherein at least one actuator being subject to a zero voltage; (iii) translate and rotate simultaneously with respect to the base by applying different voltages to all actuators, wherein none of the actuators being subject to a zero voltage.

* * * * *